(12) United States Patent
Hess et al.

(10) Patent No.: US 8,570,788 B2
(45) Date of Patent: Oct. 29, 2013

(54) METHOD AND APPARATUS FOR POWER DOMAIN ISOLATION DURING POWER DOWN

(75) Inventors: Greg M. Hess, Mountain View, CA (US); Naveen Javarappa, San Jose, CA (US)

(73) Assignee: Apple Inc., Cupertino, CA (US)

( * ) Notice: Subject to any disclaimer, the term of this patent is extended or adjusted under 35 U.S.C. 154(b) by 299 days.

(21) Appl. No.: 13/095,202

(22) Filed: Apr. 27, 2011

(65) Prior Publication Data

US 2012/0275236 A1  Nov. 1, 2012

(51) Int. Cl.
G11C 11/00 (2006.01)
(52) U.S. Cl.
USPC .......................... 365/154; 365/226; 365/227
(58) Field of Classification Search
USPC .......................................... 365/154, 226, 227
See application file for complete search history.

(56) References Cited

U.S. PATENT DOCUMENTS

| 6,385,102 B2 | 5/2002 | Nygren |
| 6,775,180 B2 * | 8/2004 | Biyani et al. ............ 365/154 |
| 7,346,784 B1 | 3/2008 | Theron |
| 2008/0307240 A1 | 12/2008 | Dahan et al. |
| 2010/0202238 A1 | 8/2010 | Moshayedi et al. |

* cited by examiner

*Primary Examiner* — Jason Lappas
(74) *Attorney, Agent, or Firm* — Lawrence J. Merkel; Erik A. Heter; Meyertons, Hood, Kivlin, Kowert and Goetzel, P.C.

(57) ABSTRACT

An apparatus and method for isolating circuitry from one power domain from that of another power domain prior to performing a power down operation is disclosed. In one embodiment, circuitry in a first power domain is coupled to receive signals based on outputs from circuitry in a second power domain. The signals may be conveyed to the circuitry in the first power domain via passgate circuits. When powering down the circuitry of the first and second power domains, a control circuit may first deactivate the passgate circuits in order to isolate the circuitry of the first power domain from that of the second power domain. The circuitry in the second power domain may be powered off subsequent to deactivating the passgate circuits. The circuitry in the first power domain may be powered off subsequent to powering off the circuitry in the second power domain.

10 Claims, 4 Drawing Sheets

METHOD AND APPARATUS FOR POWER DOMAIN ISOLATION DURING POWER DOWN

BACKGROUND

1. Field of the Invention

This invention relates to electronic circuits, and more particularly, to circuitry for isolating power domains from one another during power down operations.

2. Description of the Related Art

In many modern integrated circuits (ICs), the circuitry of different functional units may be implemented within different power domains. The reasons for implementing circuits in different power domains may vary. For example, some functional units may have different operating voltage requirement than others. Accordingly, circuits with different operating voltage requirements with respect to other circuits may be implemented in separate power domains.

Another reason for implementing different circuits in different power domains may be due to power saving requirements. While the circuitry of two different functional units may operate at the same supply voltage, the arrangement of an IC on which they are both implemented may require that one be capable of being powered down while the power is still applied to the other.

Although an IC may implement various functional units in different power domains, many of these functional units may be interfaced with others in other power domains. When functional units of two different power domains are both receiving power, communications between them may occur. Communications between the two functional units may be inhibited when one or both are powered down.

SUMMARY

An apparatus and method for isolating circuitry from one power domain from that of another power domain prior to performing a power down or a power up operation is disclosed. In one embodiment, circuitry in a first power domain is coupled to receive signals based on outputs from circuitry in a second power domain. The signals may be conveyed to the circuitry in the first power domain via passgate circuits. When powering down (i.e. removing power from) or powering up (i.e. applying power to) the circuitry of the first and second power domains, a control circuit may first deactivate the passgate circuits in order to isolate the circuitry of the first power domain from that of the second power domain. During a power down operation, the circuitry in the second power domain may be powered off subsequent to deactivating the passgate circuits. The circuitry in the first power domain may be powered off subsequent to powering off the circuitry in the second power domain. During a power up operation, the circuitry in the first power domain may be powered up prior to powering up the circuitry in the second domain. The control circuitry may deactivate the passgate circuits prior to powering up the circuitry in the first power domain, and may allow the passgates to be activated subsequent to powering up the second power domain, In one embodiment, a processor core is implemented in first power domain of an integrated circuit (IC) and a memory is implemented in a second power domain of the IC. In one embodiment, the memory may be a static random access memory (SRAM) used as a cache memory. The memory may be coupled to provide signals to respective gate terminals of one or more n-channel metal oxide semiconductor (NMOS) transistors coupled to global bit lines in the first power domain. Passgate circuits may be implemented on the global bit lines, between the NMOS transistors and dynamic-to-static converter circuitry. During normal operations, reads of the SRAM may cause signals to be provided to the respective gate terminals of the NMOS transistors, which may in turn cause corresponding signals to be conveyed on the global bit lines to the dynamic-to-static converter circuitry. Prior to an operation where the second power domain (or both power domains) are to have circuitry therein powered down, a control circuit may deactivate the passgates, thereby isolating the portion of each global bit line coupled between its respective NMOS device and the passgate circuit. This may in turn effectively isolate the SRAM from the dynamic-to-static converter circuitry, and prevent indeterminate or erroneous data from being conveyed to the ends of global bit lines coupled to a functional unit (e.g., a processor core) coupled to the static outputs of the dynamic-to-static converter circuitry. After the deactivation of the passgates, the circuitry of the second power domain, including the SRAM may be powered down. The circuitry of the first power domain may be powered down subsequent to the powering down of the circuitry of the second power domains.

In one embodiment, a method includes determining that the circuitry one or more power domains are to be powered down, including a first power domain coupled to receive signals from circuitry in a second power domain. In an operation in which the circuitry of at least the second power domain is to be powered down, isolation signals may be generated to deactivate one or more gating circuits each implemented as part of a corresponding signal line. The gating circuits, when active, are operable to convey signals corresponding to those provided from the circuitry of the second power domain to circuitry in the first power domain. When the gating circuits are disabled, the circuitry of the first power domain is effectively isolated from receiving signals corresponding to those provided by the circuitry of the first power domain. Subsequent to disabling the gating circuits, the circuitry of the second power domain may be powered down.

Isolating the circuitry of the second power domain from that of the first power domain may prevent indeterminate data from being conveyed on the signal lines. Such isolation may also prevent power contention issues between circuitry configured to drive the signal lines based on signals received from circuitry in the second power domain and dynamic-to-static circuitry in the first power domain.

BRIEF DESCRIPTION OF THE DRAWINGS

The following detailed description makes reference to the accompanying drawings, which are now briefly described.

Figure 1:
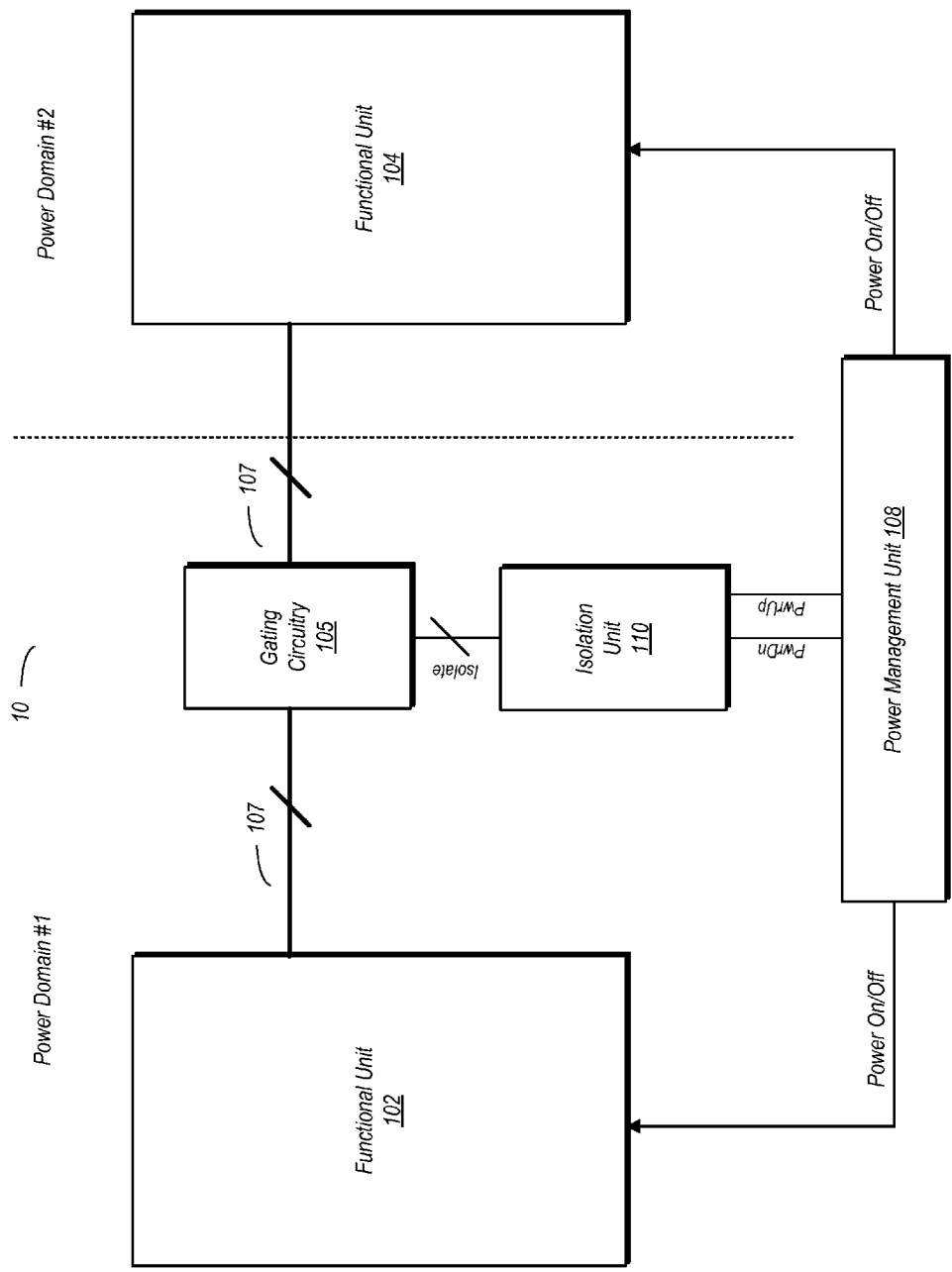
FIG. 1 is a block diagram of one embodiment of an integrated circuit (IC).

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Exemplary IC and Exemplary Interface Between Power Domains

Turning now to FIG. 1, a block diagram of one embodiment of an integrated circuit (IC) is illustrated. In the embodiment shown, IC 10 includes functional unit 102 in power domain #1 and functional unit 104 in power domain #2. Additional functional units may be present, as well as additional circuitry not explicitly shown here, including within power domains #1 and #2. Functional units 102 and 104 may be implemented using various types of circuitry that provide certain functionality. For example, in one embodiment, functional unit 102 may be a processor core, while functional unit 104 may be a cache memory implemented using static random access memory (SRAM).

In the embodiment shown, functional unit 104 may communicate with functional unit 102 via bus 107, which may include a number of signal lines configured to convey information from the former to the latter. Gating circuitry 105 in the embodiment shown may effectively bisect bus 107 into separate segments. As will be explained below, gating circuitry 105 may include a number of passgates or similar circuits that, when enabled, may be transparent to signals on the individual signal lines of bus 107. During operation of IC 10 when the circuitry of both power domains #1 and #2 are receiving power, the passgates of gating circuitry 105 may be enabled.

IC 10 includes power management unit 108 in the illustrated embodiment, which may be implemented in either one of power domains #1 or #2, or may be implemented in another power domain altogether. Power management unit 108 may implement functionality to control whether circuitry of the various power domains is powered up (i.e. receiving power) or powered down (i.e. not receiving power). Such control may be useful to reduce the overall power consumption of IC 10 by powering down circuitry that is idle. In the embodiment shown, power management unit 108 is coupled to both functional unit 102 and functional unit 104, and thus may apply or remove power to these units based on a power management scheme. Furthermore, power management unit 108 may remove or apply power to functional units 102 and 104 independently of one another.

IC 10 also includes an isolation unit 110. In the embodiment shown, isolation unit 110 is coupled to receive a signal 'PwrDn' indicating that power management unit 108 is going to power down one or both of functional units 102 and 104. Responsive to receiving the indication from power management unit 108, isolation unit 110 may assert one or more isolation signals ('Isolate') that may be received by gating circuitry 105. Responsive to receiving these signals, the individual gating circuits of gating circuitry 105 may be disabled, effectively creating on open circuit on bus 107 and thereby preventing communications between functional units 102 and 104. Subsequent to disabling the gating circuits, power management unit 108 may power down one or both of the functional units 102 and 104. Isolation unit 110 is also coupled to receive a signal 'PwrUp' indicating that power management unit 108 is to power up at least functional unit 102 (irrespective of whether functional unit 104 is powered up at that time). Isolation unit 110 may assert the isolation signals during the powering up of functional 102 such that it remains isolated from, and therefore unaffected by, functional unit 104 at least until the operation is complete and functional unit 102 is fully initialized and operating. Subsequent thereto, the isolation signals may be de-asserted.

Although not explicitly shown here, some embodiments of isolation unit 110 may be configured to assert an acknowledgement signal that is returned to power management unit 108 in order to indicate that the gating circuits have been disabled. In such embodiments, power management unit 108 may delay the powering down of either of the functional units until the acknowledgement signal has been received. In other embodiments, power management unit 108 may be configured to allow a certain amount of time to elapse before powering down any functional units, and thus an acknowledgement signal may not be implemented.

The isolation function provided by isolation unit 110 may be useful in preventing erroneous communications or contention issues in powering down circuitry in the different power domains. In some embodiments of IC 10, some functional units may be capable of powering down faster than functional units of an adjacent power domain to which they are coupled to communicate. Using the example noted above, functional unit 104, when implemented as an SRAM, may be capable of powering down faster than functional unit 102, when implemented as a processor core. If functional unit 104 is powered down before functional unit 102, the respective states of signal lines on bus 107 may be affected by indeterminate data received from functional unit 104, potentially causing the issues noted above if gating circuitry 105 remains enabled.

Without the isolation function, the functional unit that is first to be powered down may cause indeterminate states and/or signal contention issues on the signal lines of bus 107. This in turn may cause erroneous operation of any functional unit that is coupled to receive signals via these signal lines and remains powered on. By disabling the individual gating circuits of gating circuitry 105, these issues may be prevented since the functional units connected by the signal lines of bus 107 may be electrically isolated from each other. Accordingly, if a functional unit of one power domain is quicker to power down than that of another power domain to which it is coupled, the issues noted above may be avoided.

Figure 2:
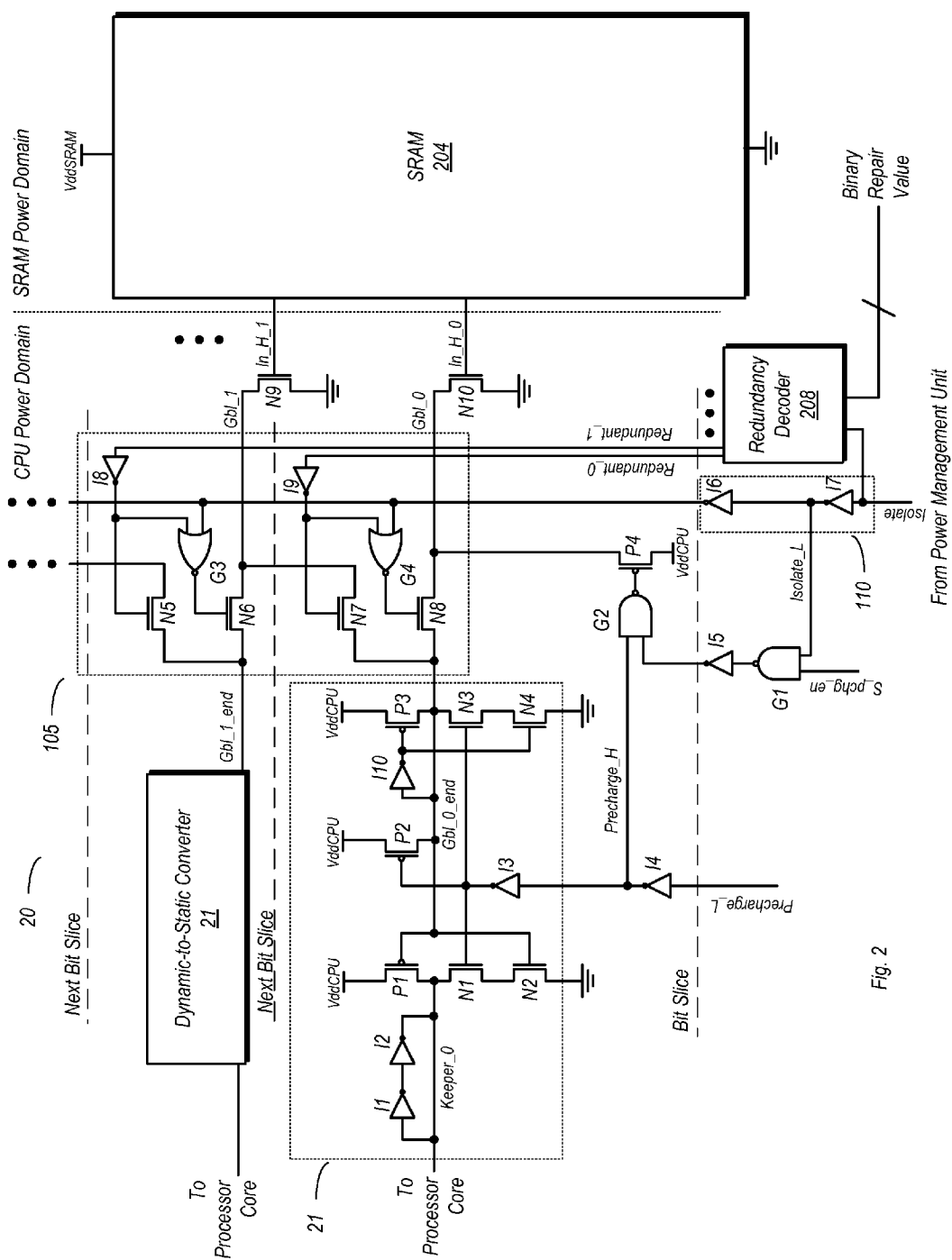
FIG. 2 is a schematic diagram of one embodiment of an interface between a memory in one power domain and a dynamic-to-static converter circuit in another power domain.

FIG. 2 is a schematic diagram of one embodiment of an interface between a memory in one power domain and a dynamic-to-static converter circuit in another power domain. Circuit 20 in the embodiment shown includes circuitry in a first power domain and a second power domain. The circuit may be divided into a number of bit slices. The dynamic-to-static converter circuit 21 illustrated in detail in the embodiment shown is applicable to one of a number of the bit slices, and may be coupled to provide an output signal to a processor core that is not shown here for the sake of simplicity. The processor core may correspond to at least a part of functional unit 102 as shown in FIG. 1.

It is noted that transistors designated with a 'P' in the illustrated example are p-channel metal oxide semiconductor (PMOS) devices, while transistors designated with an 'N' are n-channel metal oxide semiconductor (NMOS) devices. It is noted that the arrangement of the devices in the illustrated embodiment are exemplarily, and that other arrangements using other types of devices may fall within the scope of this disclosure.

In the embodiment shown, circuit 20 may be one of a number of possible specific implementations of the generalized embodiment illustrated in FIG. 1. In this particular example, circuitry in a central processing unit (CPU) power domain is coupled to receive signals from SRAM 204 in an SRAM power domain. Circuitry in the CPU power domain is arranged to receive the supply voltage VddCPU, while SRAM 204 (as well as other any other circuitry that may be implemented in the SRAM power domain) is coupled to receive the supply voltage VddSRAM. These two supply voltages may be different from one another in the embodiment shown, although embodiments where these voltages are substantially the same are possible and contemplated. Although not explicitly shown in this example, a power management unit 108 may be coupled to provide or inhibit the supply voltages VddCPU and VddSRAM to the circuitry in their respective power domains.

SRAM 204 in the embodiment shown may be configured to provide signals to a number of input circuits, the number of input circuits including transistors N9 and N10 in this particular example. For the sake of simplicity, only these two devices are shown in FIG. 2, although it is understood that a larger number of devices may be present in accordance with the width of the data path of a read port in SRAM 204. For example, if the width of the data path is 32 bits, than 32 input circuits may be implemented, along with the same number of instances of the other circuits shown.

Transistors N9 and N10 in the embodiment shown may serve as inputs to dynamic circuitry of respective dynamic-to-static converter circuits 21. One instance of a dynamic-to-static converter circuit 21 is shown in detail in FIG. 2. Each dynamic-to-static converter circuit 21 may be coupled to one of two possible global bit lines through passgate circuitry implemented in gating circuitry 105. For example, the instance of dynamic-to-static converter circuit 21 illustrated in detail (i.e. associated with Gbl_0_end may be coupled to transistor N10 is passgate transistor N8 is active, or to transistor N9 if passgate transistor N7 is active).

It is noted that additional input circuits (not shown here for the sake of simplicity) may also be coupled to each global bit line. For example, in addition to N10, a number of additional NMOS devices may also be coupled to GBL_0. Each of these additional devices may have a respective gate terminal coupled to a corresponding bit line of SRAM 204. Furthermore, the devices may be arranged in a one-hot multiplexer configuration, wherein a maximum of one of the devices coupled to a given global bit line may be active at a given time.

The particular arrangement shown in FIG. 2 provides a redundancy multiplexer, and thus SRAM 204 may be implemented as a redundant memory array that may provide protection against failure of specific memory cells or groups thereof. Thus, only one of passgate transistors N7 or N8 may be active at any given time during normal operation. The determination of which of these devices is active during normal operation may be made according to a binary repair value (determined during a manufacturing test) received by redundancy decoder 208. Based on the received binary repair value, redundancy decoder may assert active low signals (i.e. considered asserted when low in this embodiment) such as 'Redundant_0', 'Redundant_1', and so forth. When one of these signals is active low, a corresponding redundant passgate circuit is enabled, while the normal passgate is disabled. For example, if 'Redundant_0' is low, the output of inverter I9 is high, thereby causing the activation of redundant passgate N7. The high output of inverter I9 is also received by NOR gate G4, causing it to provide a low output to the gate of passgate G8, which in turn causes this device to be inactive. An active low on 'Redundant_1' may have a similar effect by causing the enabling of N5 via the output of I8 and the disabling of N6 via the output of G3.

When a given redundancy signal is high, a corresponding normal passgate may be enabled while the respective redundant passgate is disabled. For example, if 'Redundant_0' is high, the output of inverter I9 is low and thus redundant passgate N7 is disabled. If the output of inverter I6 is also low (which may occur when the 'Isolate' signal is low), NOR gate G4 outputs a high and may thus activate passgate N8.

It is noted that the active one of a given pair of passgate devices (e.g., N8 and redundant passgate N7) may change during normal operation. For example, responsive to SRAM 204 receiving a first address, passgate N8 may be active while passgate N7 is inactive. Responsive to SRAM 204 receiving a second address, passgate N8 may be inactive while passgate N7 is active. The active one of these two passgates may be determined by the address received by SRAM 204 and the binary repair value. However, only one passgate device of a given pair may be active for a particular address.

Operation of the dynamic-to-static converter circuit 21 in the embodiment shown may be divided into a precharge phase and an evaluation phase. During operation in the precharge phase, the signal 'Precharge_L' may be held low. This signal may be propagated through inverters I4 and I3, the latter of which may output a low to activate precharge device P2. When P2 is active, the global bit line 'GBL_0_end' may be pulled high. Global bit line 'GBL_0' may also be pulled high through passgate N8 to a voltage that is approximately a threshold voltage (i.e. the threshold voltage of N8) below the value to which 'GBL_0_end' is pulled (assuming P4 is inactive).

Transistor P4 in the embodiment shown provides a secondary precharge transistor coupled to precharge 'GBL_0'. When the output of inverter I7 ('Isolate_L') is high, and the secondary precharge is enable (when 'S_pchg_en' is high), both inputs to NAND gate G1 are low. Accordingly, the output of inverter I5 is correspondingly high at this time. When the 'Precharge_L' is low, the output of inverter I4 ('Precharge_H') is high, and thus both inputs to NAND gate G2 are high. Responsive to the two high inputs, NAND gate G2 outputs a low to the gate terminal of P4, thereby activating this device and thus causing a precharge of 'GBL_0' independent of the precharge of 'GBL_0_end'. However, it is noted that the secondary precharge circuitry is not required for all embodiments. Furthermore, the secondary precharge circuitry may be disabled for at least some of the time in some embodiments in which it is included.

The 'Precharge_L' signal that initiates the precharge phase may be derived from a clock signal in one embodiment. Thus, when the clock signal is low, the 'Precharge_L' may correspondingly be low, causing the precharge operation to take place. When the clock signal is high, the 'Precharge_L' signal may correspondingly be high, and thus the precharge devices may be inhibited at this time. In other embodiments, the 'Precharge_L' signal may be generated independently of a clock signal.

When the precharge operation is complete, circuit 20 may operate in an evaluation phase. During the evaluation phase, a precharged global bit line may remain high if none of the input devices to which it is coupled (e.g., N10, coupled to 'GBL_0') is activated. If one of the input devices coupled to a given global bit line is activated, the global bit line (e.g., 'GBL_0') may be pulled low during the evaluation phase, and this low may be propagated to its corresponding portion of the global bit line (e.g., 'GBL_0_end') on the other side of the respective passgate device (e.g., N8).

During the evaluation phase, the precharge signal, 'Precharge_L', may be high. Accordingly, the output of inverter I3, which is coupled to respective gate terminals of transistors N1 and N3, is also high. Accordingly, transistors N1 and N3 are active during the evaluation phase. Transistor N3 is a component of a gated keeper circuit that also includes inverter I10 and transistors P3 and N4. When N3 is active, the gated keeper circuit may hold 'GBL_0_end' low if it evaluates low during the evaluation phase, via the pull-down path through N3 and N4. Otherwise, 'GBL_0_end' may be held high through transistor P3, which may be activated due to the low output from I10 resulting from a high on 'GBL_0_end'. During the precharge phase, transistor N3 may be inactive, thereby blocking the pull-down path between 'GBL_0_end' and ground.

Transistor N1 in the embodiment shown is one component of a gated inverter circuit that also includes transistors P1 and N2. When 'GBL_0_end' evaluates low during the evaluation phase, transistor P1 may be activated and may thus pull node 'Keeper_0' high. When 'GBL_0_end' evaluates high during the evaluation phase, transistor N2 is activated, and thus 'Keeper_0' may be pulled low through N1 and N2. During the precharge phase, N1 is inactive due to the low output from I3, while P1 is inactive due to 'GBL_0_end' being precharged high. Accordingly, the gated inverter blocks signal propagation during the precharge phase. A static keeper including inverters I1 and I2 may hold, during the precharge phase, the most recently driven value on 'Keeper_0' (i.e. the value driven thereon during the evaluation phase preceding the precharge phase). Since 'Keeper_0' is not subject to a precharge in the illustrated embodiment, it is a static node. It is also noted that the logic value driven on 'Keeper_0' during the evaluation phase may be the logical equivalent of the value output by SRAM 204 to the gate terminals of the input devices (e.g., N9, N10) in this embodiment.

As noted above, for each end global bit line (e.g., 'GBL_0_end'), at least one passgate device coupled thereto may be active during normal operation. However, if the SRAM domain is to be powered down, or both power domains are to be powered down, each active passgate device may be turned off without turning on any of the previously inactive passgates. When each passgate device is inactive, SRAM 204 is electrically isolated from the corresponding dynamic-to-static converter circuits 21 in the CPU power domain. This isolation may be performed in order to prevent signals conveyed from SRAM 204 from affecting other circuitry coupled to the dynamic-to-static converter circuits 21, as SRAM 204 may be capable of powering down quicker than circuitry in the CPU power domain.

In the embodiment shown, circuit 20 includes isolation unit 110, which is coupled to receive the 'Isolate' signal from a power management unit (e.g., power management unit 108 of FIG. 1). In this particular embodiment, isolation unit 110 includes inverters I6 and I7, as well as various signal connections. The output of inverter I6 may be provided to an input of each NOR gate associated with a given bit slice (e.g., to G3, G4, as well as NOR gates associated with other bit slices not explicitly shown). Inverter I6 may produce a high on its output responsive to the power management unit asserting the 'Isolate' signal high. The high output from inverter I6 may be received by NOR gates G3 and G4, which may respond by outputting a low to passgate devices N6 and N8, respectively. Responsive to the low on their respective gate terminals, N6 and N8 may be held inactive, thereby isolating 'GBL_1' from 'GBL_1_end' and 'GBL_0' from 'GBL_0_end', respectively.

The isolate signal may also be received by redundancy decoder 208. As noted above, redundancy decoder 208 may provide active low signals corresponding to redundancy passgates that are to be activated, based on a received binary repair value. However, responsive to receiving the 'Isolate' signal, redundancy decoder may drive or hold each of its respectively provided output signals high. Accordingly, any previously active redundant passgates may be deactivated, while inactive redundant passgates may be held inactive. For example, if passgate N7 is active prior to redundancy decoder 208 receiving the 'Isolate' signal, the low-to-high transition of 'Redundant_0' may cause inverter I9 to output a low. Passgate N7 may thus be deactivated responsive to receiving the low. Furthermore, if passgate N5 was inactive prior to redundancy decoder 208 receiving the 'isolate' signal, it may remain inactive responsive to the continued high output of 'Redundant_1'.

As noted above in the discussion related to FIG. 1, the power management unit may assert the 'Isolate' signal prior to powering down the SRAM power domain. Once sufficient time has elapsed for the passgates to be deactivated, SRAM 204 and any other circuitry in the SRAM power domain may be powered down. Powering down of the CPU power domain may subsequent to powering down of SRAM 204 and other circuitry that may be in the SRAM power domain.

Assertion of the 'Isolate' signal may also disable the secondary precharge circuit in embodiments that are so configured. In the embodiment shown, the output of inverter I7 may provide an active low 'Isolate_L' signal responsive to assertion of the 'Isolate' signal. When 'Isolate_L' is low, the output of NAND gate G1 is high, even if 'S_pchg_en' is asserted high. Accordingly, the high output by G1 is inverted into a low by inverter I5, which in turn results in NAND gate G2 outputting a high to the gate terminal of secondary precharge transistor P4. Accordingly, assertion of the 'Isolate' signal may inhibit a precharge operation from occurring to the portions of the global bit lines coupled thereto, regardless of any precharge that may be performed in the dynamic-to-static converter circuits 21.

Method Embodiment

Figure 3:
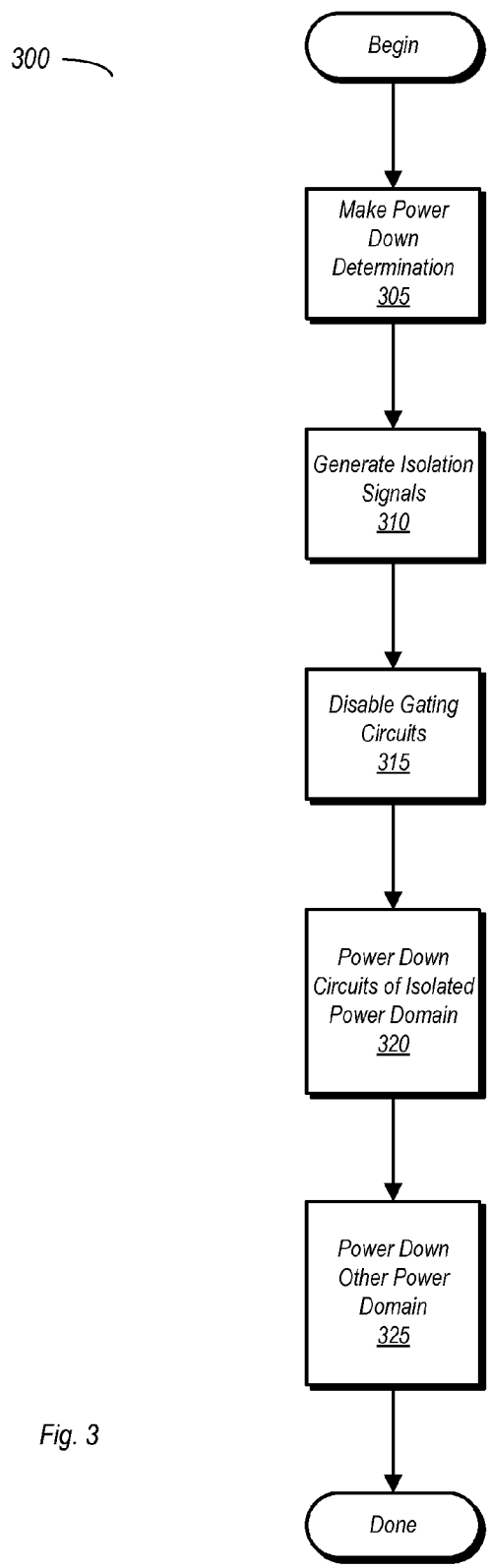
FIG. 3 is a flow diagram of one embodiment of a method for powering down power domains of an IC.

FIG. 3 is a flow diagram of one embodiment of a method for powering down power domains of an IC. The method may be applied to the embodiments discussed above in reference to FIGS. 1 and 2, as well as to other embodiments not explicitly shown or discussed here.

Method 300 begins with the determination that various power domains of an IC are to be powered down (block 305). In on example, the determination may be made a power management unit in order to conserve power in an IC where circuitry of various power domains is idle. Another example may include powering down circuitry of various power domains due to thermal considerations such as exceeding a specified temperature threshold.

Subsequent to making the power down determination, the power management unit may assert one or more isolation signals (block 310). The isolation signals may be provided to a control unit coupled to circuitry used in interfacing circuits of one power domain to those of another power domain. Responsive to receiving an isolation signal, a control circuit may disable one or more gating circuits (block 315). The gating circuits may enable communication between circuits in different power domains when active. Disabling the gating circuits may isolate the circuits of the different power domains from one another, thereby ensuring that erroneous or indeterminate data is not inadvertently provided to one of the circuits.

Subsequent to disabling the gating circuits, circuitry from an isolated one of the power domains may be powered down (block 320). The power domain for which circuitry is powered down may be one the circuitry may power down quicker than other circuits of another power domain to which it is coupled. Using the example of FIG. 2, SRAM 204 may be capable of powering down faster than circuits in the CPU power domain. Thus, when powered down in accordance with method 300, the circuitry in the SRAM power domain, including SRAM 204, may be powered down prior to circuitry in the CPU power domain.

After powering down the circuitry of one of the power domains as discussed in the previous paragraph, circuitry of another power domain to which it is coupled may be powered down (block 325). In some embodiments, circuitry in additional power domains may also be powered down.

It is noted that a similar method may be performed for performing a power up of circuitry in different power domains. For example, power management unit 108 of FIG. 1 may assert the PwrUp signal to isolation unit 110 prior to powering up functional unit 102 (regardless of whether functional unit 104 is powered up or down at the time). Isolation unit 110 may then assert the isolation signals in order to isolate functional unit 102 from functional 104 at least until the power up operation is complete.

Exemplary System

Figure 4:
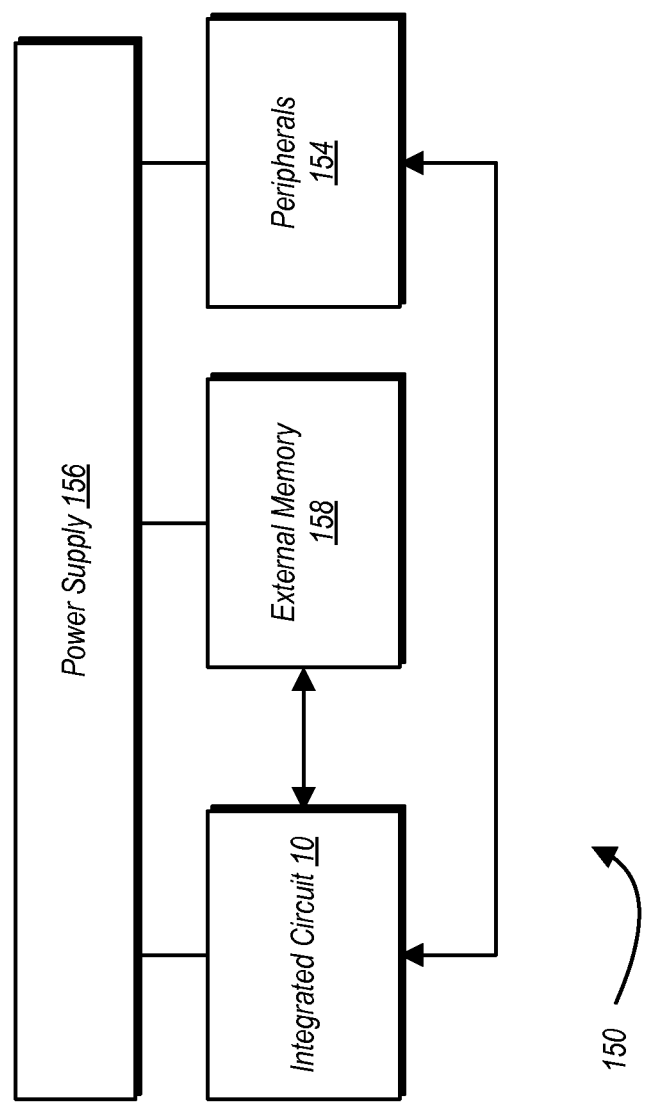
FIG. 4 is a block diagram of one embodiment of a system.

Turning next to FIG. 4, a block diagram of one embodiment of a system 150 is shown. In the illustrated embodiment, the system 150 includes at least one instance of an IC 10 (e.g., from FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMM5), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a first functional unit in a first power domain;
   a second functional unit in a second power domain;
   a gating circuit coupled between the first functional unit and the second functional unit, wherein the first functional unit is coupled to the second functional unit via the gating circuit, and wherein the gating circuit is configured to be, when enabled, transparent to a signal conveyed between the first functional unit and the second functional unit;
   an isolation circuit, wherein the isolation circuit is configured to disable the gating circuit prior to powering down one of the first or second functional units, wherein the gating circuit is configured to, when disabled, inhibit signals from being conveyed between the first and second functional units.

2. The integrated circuit as recited in claim 1, wherein the second functional unit includes one or more dynamic logic circuits, and wherein the first functional unit includes one or more corresponding dynamic-to-static converter circuits.

3. The integrated circuit as recited in claim 2, wherein the first functional unit includes an input circuit coupled to receive an input signal from the second functional units, wherein the input circuit is configured to, when active, drive a first bit line.

4. The integrated circuit as recited in claim 3, wherein the bit line is coupled to the gating circuit, wherein the gating circuit is coupled between the first bit line and the second bit line, and wherein the isolation circuit is configured to disable the gating circuit prior to powering down the second functional unit.

5. The integrated circuit as recited in claim 1, wherein the second functional unit is a memory circuit.

6. A method comprising:
   a power management unit asserting a control signal responsive to determining to power down a first functional unit in a first power domain that is coupled to provide signals to a second functional unit in a second power domain;
   disabling one or more gating circuits coupled between the first functional unit and the second functional unit;
   inhibiting signals from being provided from the first functional unit to the second functional unit responsive disabling the one or more gating circuits;
   removing power from the first functional unit subsequent to disabling the one or more gating circuits.

7. The method as recited in claim 6, wherein disabling the one or more gating circuits includes disabling at least one of a passgate coupled between a first bit line and a second bit line and a redundant passgate coupled between a third bit line and the second bit line.

8. The method as recited in claim 7, further comprising providing the control signal to a redundancy decoder.

9. The method as recited in claim 8, further comprising the redundancy decoder asserting a redundancy control signal responsive to receiving the control signal.

10. The method as recited in claim 6, further comprising removing power from circuitry in the second power domain subsequent to removing power from the circuitry in the first power domain.

* * * * *